(12) United States Patent
Hudait et al.

(10) Patent No.: US 8,617,945 B2
(45) Date of Patent: Dec. 31, 2013

(54) STACKING FAULT AND TWIN BLOCKING BARRIER FOR INTEGRATING III-V ON SI

(75) Inventors: Mantu K. Hudait, Portland, OR (US); Mohamad A. Shaheen, Portland, OR (US); Loren A. Chow, Santa Clara, CA (US); Peter G. Tolchinsky, Beaverton, OR (US); Joel M. Fastenau, Bethlehem, PA (US); Dmitri Loubychev, Bethlehem, PA (US); Amy W. K. Liu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/366,143

(22) Filed: Feb. 3, 2012
(Under 37 CFR 1.47)

(65) Prior Publication Data
US 2012/0142166 A1 Jun. 7, 2012

Related U.S. Application Data

(62) Division of application No. 11/498,901, filed on Aug. 2, 2006, now Pat. No. 8,143,646.

(51) Int. Cl.
*H01L 21/338* (2006.01)

(52) U.S. Cl.
USPC ............ 438/172; 438/46; 438/47; 438/93; 438/94; 438/191; 438/938; 257/190; 257/200; 257/201; 257/615; 257/E21.09; 257/E21.097; 257/E21.098; 257/E21.108; 257/E21.109; 257/E21.112

(58) Field of Classification Search
USPC ............ 257/190, 200, 201, 615, E21.09, 257/E21.097, E21.098, E21.108, E21.109, 257/E21.112; 438/46, 47, 93, 94, 172, 191, 438/938

See application file for complete search history.

(56) References Cited

U.S. PATENT DOCUMENTS

| 4,231,149 A | 11/1980 | Chapman et al. |
| 4,487,652 A | 12/1984 | Almgren |

(Continued)

FOREIGN PATENT DOCUMENTS

| DE | 10203998 | 8/2003 |
| EP | 0 265 314 A1 | 4/1988 |

(Continued)

OTHER PUBLICATIONS

Yano et al., "Time-resolved reflection high energy electron diffraction analysis for atomic layer depositions of GaSb by molecular beam epitaxy", Journal of Crystal Growth 146 (1995) pp. 349-353.*

(Continued)

*Primary Examiner* — Jay C Kim
(74) *Attorney, Agent, or Firm* — Blakely, Sokoloff, Taylor & Zafman LLP

(57) ABSTRACT

A stacking fault and twin blocking barrier for forming a III-V device layer on a silicon substrate and the method of manufacture is described. Embodiments of the present invention enable III-V InSb device layers with defect densities below $1 \times 10^8 \text{ cm}^{-2}$ to be formed on silicon substrates. In an embodiment of the present invention, a buffer layer is positioned between a III-V device layer and a silicon substrate to glide dislocations. In an embodiment of the present invention, GaSb buffer layer is selected on the basis of lattice constant, band gap, and melting point to prevent many lattice defects from propagating out of the buffer into the III-V device layer. In a specific embodiment, a III-V InSb device layer is formed directly on the GaSb buffer.

10 Claims, 9 Drawing Sheets

(56) References Cited

U.S. PATENT DOCUMENTS

| | | | |
|---|---|---|---|
| 4,711,701 A | 12/1987 | McLevige | |
| 4,751,201 A | 6/1988 | Nottenburg et al. | |
| 4,818,715 A | 4/1989 | Chao | |
| 4,871,692 A | 10/1989 | Lee et al. | |
| 4,872,046 A | 10/1989 | Morkoc et al. | |
| 4,905,063 A | 2/1990 | Beltram et al. | |
| 4,906,589 A | 3/1990 | Chao | |
| 4,907,048 A | 3/1990 | Huang | |
| 4,914,059 A | 4/1990 | Nissim et al. | |
| 4,994,873 A | 2/1991 | Madan | |
| 4,996,574 A | 2/1991 | Shirasaki et al. | |
| 5,023,203 A | 6/1991 | Choi | |
| 5,120,666 A | 6/1992 | Gotou | |
| 5,124,777 A | 6/1992 | Lee | |
| 5,141,893 A * | 8/1992 | Ito et al. | 117/89 |
| 5,144,378 A | 9/1992 | Hikosaka | |
| 5,179,037 A | 1/1993 | Seabaugh | |
| 5,216,271 A | 6/1993 | Takagi et al. | |
| 5,278,102 A | 1/1994 | Horie | |
| 5,308,999 A | 5/1994 | Gotou | |
| 5,328,810 A | 7/1994 | Lowrey et al. | |
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,391,506 A | 2/1995 | Tada et al. | |
| 5,428,237 A | 6/1995 | Yuzurihara et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,495,115 A | 2/1996 | Kudo et al. | |
| 5,514,885 A | 5/1996 | Myrick | |
| 5,521,859 A | 5/1996 | Ema et al. | |
| 5,543,351 A | 8/1996 | Hirai et al. | |
| 5,545,586 A | 8/1996 | Koh | |
| 5,563,077 A | 10/1996 | Ha | |
| 5,576,227 A | 11/1996 | Hsu | |
| 5,578,513 A | 11/1996 | Maegawa | |
| 5,595,919 A | 1/1997 | Pan | |
| 5,595,941 A | 1/1997 | Okarnoto et al. | |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,698,869 A | 12/1997 | Yoshimi et al. | |
| 5,701,016 A | 12/1997 | Burroughes et al. | |
| 5,716,879 A | 2/1998 | Choi et al. | |
| 5,739,544 A | 4/1998 | Yuki et al. | |
| 5,760,442 A | 6/1998 | Shigyo et al. | |
| 5,770,513 A | 6/1998 | Okaniwa | |
| 5,773,331 A | 6/1998 | Solomon et al. | |
| 5,776,821 A | 7/1998 | Haskell et al. | |
| 5,793,088 A | 8/1998 | Choi et al. | |
| 5,804,848 A | 9/1998 | Mukai | |
| 5,811,324 A | 9/1998 | Yang | |
| 5,814,895 A | 9/1998 | Hirayama et al. | |
| 5,821,629 A | 10/1998 | Wen et al. | |
| 5,827,769 A | 10/1998 | Aminzadeh et al. | |
| 5,838,029 A * | 11/1998 | Shakuda | 257/190 |
| 5,844,278 A | 12/1998 | Mizuno et al. | |
| 5,856,225 A | 1/1999 | Lee et al. | |
| 5,859,456 A | 1/1999 | Efland et al. | |
| 5,880,015 A | 3/1999 | Hata | |
| 5,883,564 A | 3/1999 | Partin | |
| 5,888,309 A | 3/1999 | Yu | |
| 5,889,304 A | 3/1999 | Watanabe | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea | |
| 5,965,914 A | 10/1999 | Miyamoto | |
| 5,976,767 A | 11/1999 | Li | |
| 5,981,400 A | 11/1999 | Lo | |
| 5,985,726 A | 11/1999 | Yu et al. | |
| 6,013,926 A | 1/2000 | Oku et al. | |
| 6,018,176 A | 1/2000 | Lim | |
| 6,031,249 A | 2/2000 | Yamazaki et al. | |
| 6,051,452 A | 4/2000 | Shigyo et al. | |
| 6,054,355 A | 4/2000 | Inumiya et al. | |
| 6,063,675 A | 5/2000 | Rodder | |
| 6,063,677 A | 5/2000 | Rodder et al. | |
| 6,066,869 A | 5/2000 | Noble et al. | |
| 6,087,208 A | 7/2000 | Krivokapic et al. | |
| 6,093,621 A | 7/2000 | Tseng | |
| 6,114,201 A | 9/2000 | Wu | |
| 6,114,206 A | 9/2000 | Yu | |
| 6,117,697 A | 9/2000 | Seaford et al. | |
| 6,117,741 A | 9/2000 | Chatterjee et al. | |
| 6,120,846 A | 9/2000 | Hintermaier et al. | |
| 6,133,593 A | 10/2000 | Boos et al. | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,163,053 A | 12/2000 | Kawashima | |
| 6,165,880 A | 12/2000 | Yaung et al. | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,218,309 B1 | 4/2001 | Miller et al. | |
| 6,251,729 B1 | 6/2001 | Montree et al. | |
| 6,251,763 B1 | 6/2001 | Inumiya et al. | |
| 6,252,262 B1 | 6/2001 | Jonker et al. | |
| 6,259,135 B1 | 7/2001 | Hsu et al. | |
| 6,261,921 B1 | 7/2001 | Yen et al. | |
| 6,262,456 B1 | 7/2001 | Yu et al. | |
| 6,274,503 B1 | 8/2001 | Hsieh | |
| 6,287,924 B1 | 9/2001 | Chao et al. | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,319,807 B1 | 11/2001 | Yeh et al. | |
| 6,320,212 B1 | 11/2001 | Chow | |
| 6,335,251 B2 | 1/2002 | Miyano et al. | |
| 6,358,800 B1 | 3/2002 | Tseng | |
| 6,359,311 B1 | 3/2002 | Colinge et al. | |
| 6,362,111 B1 | 3/2002 | Laaksonen et al. | |
| 6,368,923 B1 | 4/2002 | Huang | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,406,795 B1 | 6/2002 | Hwang et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,458,662 B1 | 10/2002 | Yu | |
| 6,459,123 B1 | 10/2002 | Enders et al. | |
| 6,465,290 B1 | 10/2002 | Suguro et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,479,866 B1 | 11/2002 | Xiang | |
| 6,483,146 B2 | 11/2002 | Lee et al. | |
| 6,483,151 B2 | 11/2002 | Wakabayashi et al. | |
| 6,483,156 B1 | 11/2002 | Adkisson et al. | |
| 6,495,403 B1 | 12/2002 | Skotnicki | |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,525,403 B2 | 2/2003 | Inaba et al. | |
| 6,526,996 B1 | 3/2003 | Chang et al. | |
| 6,534,807 B2 | 3/2003 | Mandelman et al. | |
| 6,537,862 B2 | 3/2003 | Song | |
| 6,537,885 B1 | 3/2003 | Kang et al. | |
| 6,537,901 B2 | 3/2003 | Cha et al. | |
| 6,541,829 B2 | 4/2003 | Nishinohara et al. | |

(56) References Cited

U.S. PATENT DOCUMENTS

| | | |
|---|---|---|
| 6,555,879 B1 | 4/2003 | Krivokapic et al. |
| 6,562,665 B1 | 5/2003 | Yu |
| 6,562,687 B1 | 5/2003 | Deleonibus |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,607,948 B1 | 8/2003 | Sugiyama |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,884,154 B2 | 4/2005 | Mizushima et al. |
| 6,885,055 B2 | 4/2005 | Lee |
| 6,891,234 B1 | 5/2005 | Connelly et al. |
| 6,897,527 B2 | 5/2005 | Dakshina-Murthy et al. |
| 6,902,962 B2 | 6/2005 | Yeo et al. |
| 6,909,151 B2 | 6/2005 | Hareland et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,955,961 B1 | 10/2005 | Chung |
| 6,960,517 B2 | 11/2005 | Rios et al. |
| 6,967,351 B2 | 11/2005 | Fried et al. |
| 6,974,738 B2 | 12/2005 | Hareland et al. |
| 6,975,014 B1 | 12/2005 | Krivokapic et al. |
| 6,977,415 B2 | 12/2005 | Matsuo |
| 6,998,301 B1 | 2/2006 | Yu et al. |
| 6,998,318 B2 | 2/2006 | Park |
| 7,013,447 B2 | 3/2006 | Mathew et al. |
| 7,018,551 B2 | 3/2006 | Beintner et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,084,018 B1 | 8/2006 | Ahmed et al. |
| 7,105,390 B2 | 9/2006 | Brask et al. |
| 7,105,891 B2 | 9/2006 | Visokay |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,945 B2 | 10/2006 | Lee et al. |
| 7,119,402 B2 | 10/2006 | Kinoshita et al. |
| 7,122,463 B2 | 10/2006 | Ohuchi |
| 7,141,856 B2 | 11/2006 | Lee et al. |
| 7,154,118 B2 | 12/2006 | Lindert |
| 7,163,851 B2 | 1/2007 | Abadeer et al. |
| 7,163,898 B2 | 1/2007 | Mariani et al. |
| 7,183,137 B2 | 2/2007 | Lee et al. |
| 7,187,043 B2 | 3/2007 | Arai et al. |
| 7,202,503 B2 | 4/2007 | Chow et al. |
| 7,214,991 B2 | 5/2007 | Yeo et al. |
| 7,235,822 B2 | 6/2007 | Li |
| 7,238,564 B2 | 7/2007 | Ko et al. |
| 7,241,653 B2 | 7/2007 | Hareland et al. |
| 7,247,547 B2 | 7/2007 | Zhu et al. |
| 7,250,645 B1 | 7/2007 | Wang et al. |
| 7,291,886 B2 | 11/2007 | Doris et al. |
| 7,339,241 B2 | 3/2008 | Orlowski et al. |
| 7,348,284 B2 | 3/2008 | Doyle et al. |
| 7,348,642 B2 | 3/2008 | Nowak |
| 7,354,817 B2 | 4/2008 | Watanabe et al. |
| 7,358,121 B2 | 4/2008 | Chau et al. |
| 7,396,730 B2 | 7/2008 | Li |
| 7,452,778 B2 | 11/2008 | Chen et al. |
| 7,456,471 B2 | 11/2008 | Anderson et al. |
| 7,456,476 B2 | 11/2008 | Hareland et al. |
| 7,479,421 B2 | 1/2009 | Kavalieros et al. |
| 7,485,503 B2 | 2/2009 | Brask et al. |
| 7,573,059 B2 | 8/2009 | Hudait et al. |
| 7,585,734 B2 | 9/2009 | Kang et al. |
| 7,612,416 B2 | 11/2009 | Takeuchi et al. |
| 7,655,989 B2 | 2/2010 | Zhu et al. |
| 7,701,018 B2 | 4/2010 | Yamagami et al. |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0093332 A1 | 7/2002 | Schroeder et al. |

(56) References Cited

U.S. PATENT DOCUMENTS

| | | |
|---|---|---|
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2002/0185655 A1 | 12/2002 | Fahimulla et al. |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Ieong et al. |
| 2003/0080332 A1 | 5/2003 | Phillips |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0190766 A1 | 10/2003 | Gonzalez et al. |
| 2003/0201458 A1 | 10/2003 | Clark et al. |
| 2003/0203636 A1 | 10/2003 | Anthony |
| 2003/0227036 A1 | 12/2003 | Sugiyama |
| 2004/0016968 A1 | 1/2004 | Coronel et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0113181 A1 | 6/2004 | Wicker |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0169269 A1 | 9/2004 | Yeo et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0019993 A1 | 1/2005 | Lee et al. |
| 2005/0020020 A1 | 1/2005 | Collaert et al. |
| 2005/0035415 A1 | 2/2005 | Yeo et al. |
| 2005/0040429 A1 | 2/2005 | Uppal |
| 2005/0040444 A1 | 2/2005 | Cohen |
| 2005/0059214 A1 | 3/2005 | Cheng et al. |
| 2005/0062082 A1 | 3/2005 | Bucher et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0110082 A1 | 5/2005 | Cheng et al. |
| 2005/0116289 A1 | 6/2005 | Boyd et al. |
| 2005/0118790 A1 | 6/2005 | Lee et al. |
| 2005/0127362 A1 | 6/2005 | Zhang et al. |
| 2005/0127632 A1 | 6/2005 | Gehret |
| 2005/0133829 A1 | 6/2005 | Kunii et al. |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0162928 A1 | 7/2005 | Rosmeulen |
| 2005/0167766 A1 | 8/2005 | Yagishita |
| 2005/0170593 A1 | 8/2005 | Kang et al. |
| 2005/0184316 A1 | 8/2005 | Kim |
| 2005/0189583 A1 | 9/2005 | Kim et al. |
| 2005/0199919 A1 | 9/2005 | Liu |
| 2005/0202604 A1 | 9/2005 | Cheng et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224800 A1 | 10/2005 | Lindert et al. |
| 2005/0227498 A1 | 10/2005 | Furukawa |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0255642 A1 | 11/2005 | Liu et al. |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1 | 12/2005 | Doris et al. |
| 2005/0287752 A1 | 12/2005 | Nouri et al. |
| 2006/0014338 A1 | 1/2006 | Doris et al. |
| 2006/0040054 A1 | 2/2006 | Pearlstein et al. |
| 2006/0043500 A1 | 3/2006 | Chen et al. |
| 2006/0046521 A1 | 3/2006 | Vaartstra et al. |
| 2006/0063469 A1 | 3/2006 | Talieh et al. |
| 2006/0068591 A1 | 3/2006 | Radosavljevic et al. |
| 2006/0071299 A1 | 4/2006 | Doyle et al. |
| 2006/0086977 A1 | 4/2006 | Shah et al. |
| 2006/0148182 A1 | 7/2006 | Datta et al. |
| 2006/0154478 A1 | 7/2006 | Hsu et al. |
| 2006/0170066 A1 | 8/2006 | Mathew et al. |
| 2006/0172480 A1 | 8/2006 | Wang et al. |
| 2006/0172497 A1 | 8/2006 | Hareland et al. |
| 2006/0180859 A1 | 8/2006 | Radosavljevic et al. |
| 2006/0202270 A1 | 9/2006 | Son et al. |
| 2006/0204898 A1 | 9/2006 | Gutsche et al. |
| 2006/0205164 A1 | 9/2006 | Ko et al. |
| 2006/0211184 A1 | 9/2006 | Boyd et al. |
| 2006/0220131 A1 | 10/2006 | Kinoshita et al. |
| 2006/0227595 A1 | 10/2006 | Chuang et al. |
| 2006/0240622 A1 | 10/2006 | Lee et al. |
| 2006/0244066 A1 | 11/2006 | Yeo et al. |
| 2006/0263699 A1 | 11/2006 | Abatchev et al. |

(56) References Cited

U.S. PATENT DOCUMENTS

| | | | |
|---|---|---|---|
| 2006/0281325 | A1 | 12/2006 | Chou et al. |
| 2007/0001219 | A1 | 1/2007 | Radosavljevic et al. |
| 2007/0023795 | A1 | 2/2007 | Nagano et al. |
| 2007/0029624 | A1 | 2/2007 | Nowak |
| 2007/0045735 | A1 | 3/2007 | Orlowski et al. |
| 2007/0045748 | A1 | 3/2007 | Booth, Jr. et al. |
| 2007/0048930 | A1 | 3/2007 | Figura et al. |
| 2007/0052041 | A1 | 3/2007 | Sorada et al. |
| 2007/0069302 | A1 | 3/2007 | Jin |
| 2007/0090416 | A1 | 4/2007 | Doyle |
| 2007/0093010 | A1 | 4/2007 | Mathew et al. |
| 2007/0108514 | A1 | 5/2007 | Inoue et al. |
| 2007/0187682 | A1 | 8/2007 | Takeuchi et al. |
| 2007/0241414 | A1 | 10/2007 | Narihiro |
| 2007/0262389 | A1 | 11/2007 | Chau et al. |
| 2008/0017890 | A1 | 1/2008 | Yuan et al. |
| 2008/0017934 | A1 | 1/2008 | Kim et al. |
| 2008/0032478 | A1 | 2/2008 | Hudait et al. |
| 2008/0111163 | A1 | 5/2008 | Russ et al. |
| 2008/0116515 | A1 | 5/2008 | Gossner et al. |
| 2008/0128797 | A1 | 6/2008 | Dyer et al. |
| 2008/0212392 | A1 | 9/2008 | Bauer |
| 2008/0237655 | A1 | 10/2008 | Nakabayashi et al. |
| 2008/0258207 | A1 | 10/2008 | Radosavljevic et al. |
| 2009/0061572 | A1 | 3/2009 | Hareland et al. |
| 2009/0099181 | A1 | 4/2009 | Wurster et al. |
| 2010/0200923 | A1 | 8/2010 | Chen et al. |

FOREIGN PATENT DOCUMENTS

| | | |
|---|---|---|
| EP | 0 469 604 A2 | 2/1992 |
| EP | 0 474 952 A1 | 3/1992 |
| EP | 0510667 | 10/1992 |
| EP | 0623963 | 11/1994 |
| EP | 1091413 | 4/2001 |
| EP | 1202335 | 5/2002 |
| EP | 1566844 | 8/2005 |
| GB | 2156149 | 10/1985 |
| JP | 56073454 | 6/1981 |
| JP | 59145538 | 8/1984 |
| JP | 2303048 | 12/1990 |
| JP | 05 090252 A | 4/1993 |
| JP | 06005856 | 1/1994 |
| JP | 06 132521 | 5/1994 |
| JP | 6151387 | 5/1994 |
| JP | 406177089 A | 6/1994 |
| JP | 06224440 | 8/1994 |
| JP | 9162301 | 6/1997 |
| JP | 20037842 | 2/2000 |
| JP | 2000037842 | 2/2000 |
| JP | 2001-189453 | 7/2001 |
| JP | 2001338987 | 12/2001 |
| JP | 20022298051 | 10/2002 |
| JP | 2003298051 | 10/2003 |
| JP | 2005085916 A | 3/2005 |
| TW | 200414538 | 8/1992 |
| TW | 200518310 | 11/1992 |
| TW | 516232 | 1/2003 |
| TW | 561530 | 1/2003 |
| TW | 548799 | 8/2003 |
| TW | 200402872 | 2/2004 |
| TW | 200405408 | 4/2004 |
| TW | 200417034 | 9/2004 |
| WO | WO 91/06976 | 5/1991 |
| WO | WO0243151 | 5/2002 |
| WO | WO02095814 | 11/2002 |
| WO | WO03003442 | 1/2003 |
| WO | WO2004059726 | 7/2004 |
| WO | WO2005036651 | 4/2005 |

OTHER PUBLICATIONS

A. Wan et al., Characterization of GaAs grown by Molecular Beam Epitaxy on Vicinal Ge (100) Substrates. J. Vac. Sci. Technol. B 22(4) Jul./Aug. 2004, pp. 1893-1897.

Akaha et al., JP2005-85916, Mar. 31, 2005, Machine translation in English, 11 pages.

Ashley, et al., "Novel InSb-based Quantum Well Transistors for Ultra-High Speed, Low Power Logic Applications," Solid-State and Integrated Circuits Technology, 7th International Conference on, Beijing 2004, IEEE vol. 3, 4 Pages.

Balakrishnan et al., "Room-temperature optically-pumped GaSb quantum well based VCSEL monolithically grown on Si (100) substrate," Electronic Letters, vol. 42, No. 6, Mar. 16, 2006, 2 pages.

Intel Corporation Notice of Allowance for U.S. Appl. No. 11/498,901 mailed Nov. 23, 2011.

Intel Corporation Office Action for U.S. Appl. No. 11/498,901 mailed Jun. 23, 2011.

Intel Corporation Office Action for U.S. Appl. No. 11/498,901 mailed Sep. 1, 2010.

Intel Corporation Office Action for U.S. Appl. No. 11/498,901 mailed Mar. 26, 2010.

Intel Corporation Office Action for U.S. Appl. No. 11/498,901 mailed Dec. 17, 2009.

Intel Corporation Office Action for U.S. Appl. No. 11/498,901 mailed Jun. 8, 2009.

Intel Corporation Office Action for U.S. Appl. No. 11/498,901 mailed Nov. 17, 2008.

Intel Corporation Office Action for U.S. Appl. No. 11/498,901 mailed Aug. 1, 2008.

Intel Corporation Notice of Allowance for U.S. Appl. No. 12/915,557 mailed Jun. 9, 2011.

Intel Corporation Notice of Allowance for U.S. Appl. No. 11/498,685 mailed Aug. 6, 2010.

Intel Corporation Notice of Allowance for U.S. Appl. No. 11/501,253 mailed Apr. 7, 2009.

Intel Corporation Office Action for U.S. Appl. No. 11/498,685 mailed Nov. 24, 2009.

Intel Corporation Office Action for U.S. Appl. No. 11/498,685 mailed May 26, 2010.

Intel Corporation Office Action for U.S. Appl. No. 11/501,253 mailed Dec. 12, 2008.

Intel Corporation Office Action for U.S. Appl. No. 11/501,253 mailed May 14, 2008.

M. Doczy et al., US Patent Application, Extreme High Mobility CMOS Logic, U.S. Appl. No. 11/305,452, Dec. 15, 2005.

M. Mori et al. Heteroepitaxial growth of InSb films on a Si(001) substrate via AlSb buffer layer, Applied Surface Science 216 (2003) ppp. 569-574.

Nguyen et al., "Growth of heteroepitaxial GaSb thn films on Si (100) substrates," Journal of Materials Research, vol. 19, No. 8, Aug. 2004, pp. 2315-2321.

R.M. Sieg et al., Toward device-quality GaAs Growth by Molecular Beam Epitaxy on Offcut Ge/SiGe/Si substrates, J. Vac. Sci. Technol. B. 16(3) May/Jun. 1998, pp. 1471-1474.

S. Scholz et al., MOVPE Growth of GaAs on Ge Substrates by Inserting a Thin Low Temperature Buffer Layer, Cryst. Res. Technol. 41, No. 2 (2006), pp. 111-116.

Uchida et al., "Reduction of dislocation density by thermal annealing for GaAs/GaSb/Si heterostructure," Journal of Crystal Growth, 150, 1995, pp. 681-684.

T. Ashley et al., "High-Speed, Low-Pressure InSb Transistors", 1997 IEEE, IEDM 97-751, pp. 30.4.1-30.4.4.

Ashley et al. "InSb-Based Quantum Well Transistors for High Speed, Low Power Applications", QinetiQ, Malvern Technology Center and Intel (2004), 2 pages.

Bednyi et al. "Electronic State of the Surface of INP Modified by Treatment in Sulfur Vapor" Soviet Physics Semiconductors, Am. Inst. of Physics, New York, vol. 26, No. 8, Aug. 1, 1992.

V.N. Bessolov et al., "Chalcogenide Passivation of III-V Semiconductor Surfaces", 1998 American Institute of Physics, Semiconductors 32 (11), Nov. 1998.

Buchanan, D.A. "Fabrication of Midgap Metal Gates Compatible with Ultrathin Dielectrics", Applied Physics Letters 73.12 (1998), pp. 1676-1678.

(56) References Cited

OTHER PUBLICATIONS

Chau, R., "Advanced Metal Gate/High-K Dielectric Stacks for High-Performance CMOS Transistors", Proceedings of AVS 5th International Conference of Microelectronics and Interfaces, Mar. 2004, (3 pgs.).

Claflin, B. "Interface Studies of Tungsten Nitride and Titanium Nitride Composite Metal Gate Electrodes with Thin Dielectric Layers", Journal of Vacuum Science and Technology, A 16.3 (1998), pp. 1757-1761.

Datta et al. "85mm Gate Length Enhancement and Depletion Mode InSb Quantum Well Transistors for Ultra High Speed and Very Low Power Digital Logic Applications" IEEE Dec. 5, 2005, pp. 763-766.

Datta, et al., U.S. Patent Application "Extreme High Mobility CMOS Logic" U.S. Appl. No. 11/305,452, filed Dec. 15, 2005.

Frank et al., HfO2 and Al2O3 Dielectrics GaAs Grown by Atomic Layer Deposition, Applied Physics Letters, vol. 86, Issue 15, id. 152904, 2005, 1 page.

C. Gonzalez et al., "Selenium Passivation of GaAs(001): A Combined Experimental and Theoretical Study", Institute of Physics Publishing, Journal of Physics Condensed Matter, J. Phys.: Condens. Matter 16 (2004), pp. 2187-2206.

Hwang, Jeong-Mo, "Novel Polysilicon/TiN Stacked Gate Structure for Fully Depleted SOI/CMOS", International Electronic Devices Meeting Technical Digest (1992), pp. 345-348.

H.W. Jang et al. "Incorporation of Oxygen Donors in AlGaN", J. Electronchem Soc. 152, pp. G536-G540, (2004).

Jin, B. et al., "Mobility Enhancement in Compressively Strained SIGE Surface Channel PMOS Transistors with HF02/TIN Gate Stack", Proceedings of the First Joint International Symposium, 206th Meeting of Electrochemical Society, Oct. 2004, pp. 111-122.

B.A. Kuruvilla et al., "Passivation of GaAs (100) using Selenium Sulfide", 1993 American Institute of Physics, J. Appl. Phys. 73 (9), May 1, 1993, pp. 4384-4387.

D. Mistele et al., "Incorporation of Dielectric Layers into the Processing of 111-Nitride-Based Heterostructure Field-Effect Transistors", Journal of Electronic Materials, vol. 32, No. 5, 2003, pp. 355-363.

Nowak, Edward J. et al., "Turning Silicon on Its Edge," IEEE Circuits & Devices Magazine, vol. 1, (Jan./Feb. 2004), pp. 20-31.

K.Y. Park et al., "Device Charateristics of AlGaN/GaN MIS-HFET Using Al2O3-HfO2 Laminated High-k Dielectric", Japanese Journal of Applied Physics, vol. 43, No. 11A, 2004, pp. L1433-L1435.

Passlack et al., "Self-Aligned GaAs p-Channel Enhancement Mode MOS Heterostructure Field-Effect Transistor", IEEE Electron Device Letters, vol. 23, No. 9, Sep. 2002, pp. 508-510.

PCT Search Report PCT/US2006/044601, Mar. 19, 2007, 7 pages.

T. Sugizaki et al., "Novel Multi-bit SONOS Type Flash Memory Using a High-k Charge Trapping Layer" 2003 Symposium on VLSI Technology Digest of Technical Papers, pp. 27-28.

Kuo, Charles, et al., A Capacitorless Double-Gate DRAM Cell Design for High Density Applications, *IEEE*, 2002, 4 pgs.

Kuo, Charles, et al., "A Capacitorless Double Gate DRAM Technology for Sub-100-nm Embedded and Stand-Alone Memory Applications", IEEE 50(12):, (2003), 2408-2416.

Ludwig, et al., FinFET Technology for Future Microprocessors, *IEEE Int'l. SOI Conference*, New Port Beach, CA, Sep. 29-Oct. 2, 2003, 2 pgs.

Martel, Richard, et al., "Carbon Nanotube Field Effect Transistors for Logic Applications", *IEEE 2001*, 4 pgs.

Mayer, T. M., et al., "Chemical Vapor Deposition of Flouroalkylsilane Monolayer Films for Adhesion Control in Microelectromechanical Systems", *J. Vac. Sci. Technol. B*. 18(5), 2000, 8 pgs.

Nackaerts, et al., "A 0.314um2 6T-SRAM Cell build with Tall Triple-Gate Devices for 45nm node applications using 0.75NA 193nm lithography", *IEEE*, 2004, 4 pgs.

Nowak, E. J., et al., "A Functional FinFET-DGCMOS SRAM Cell", *Int'l Electron Devices Meeting*, San Francisco, CA Dec. 8-11, 2002, 4 pgs.

Nowak, E. J., et al., "Scaling Beyond the 65 nm Node with FinFET-DGCMOS", *IEEE CICC*, San Jose, CA Sep. 21-24, 2003, 4 pgs.

Ohsawa, Takashi, et al., "Memory Design Using a One-Transistor Gain Cell on SOI", *IEEE* 37(11), Nov. 2002, 13 pgs.

Park, Donggun, et al., 3-dimensional nano-CMOS Transistors to Overcome Scaling Limits, *IEEE 2004*ISBN 0-7803-8511-X, 6 pgs.

Park, Jae-Hyoun, et al., Quantum-Wired MOSFET Photodetector Fabricated by Conventional Photolighography on SOI Substrate, Nanotechnology, *4th IEEE Conference on Munich Germany*, Aug. 16-19, 2004, Piscataway, NJ, 3 pgs.

Park, T., et al., "Fabrication of Body-Tied FinFETs (Omega MOSFETS) Using Bulk Si Wafers", *2003 Symposia on VLSI Technology Digest of Technical Papers*, (Jun. 2003), pp. 135-136.

Park, Jong-Tae, et al., "Pi-Gate SOI MOSFET", *IEEE Electron Device Letters*, vol. 22, No. 8, Aug. 2001, 2 pgs.

Park, T., et al., "PMOS Body-Tied FinFET (Omega MOSFET) Characteristics", *IEEE Device Research Conference*, Piscataway, NJ, Jun. 23-25, 2003, 2 pgs.

Seevinck, Evert, et al., Static-Noise Margin Analysis of MOS SRAM Cells, *IEEE*, (SC-22)5, Oct. 1987, 7 pgs.

Stadele, M., et al., A Comprehensive Study of Corner Effects in Tri-gate Transistors, *IEEE 2004*, 4 pgs.

Stolk, Peter A., et al., Device Modeling Statistical Dopant Fluctuations in MOS Transistors, *IEEE Transactions on Electron Devices*, (45)9, 1997, 4 pgs.

Subramanian, V., "A Bulk-Si-Compatible Ultrathin-body SOI Technology for Sub-100m MOSFETS", *Proceeding of the 57th Annual Device Research Conference*, (1999), pp. 28-29.

Tanaka, T., et al., Scalability Study on a Capacitorless IT-DRAM: From Single-gate PD-SOI to Double-gate FinDRAM, *IEEE*, 2004, 4 pgs.

Tang, Stephen H., et al., FinFET—A Quasi-Planar Double-Gate MOSFET, *IEEE International Solid-State Circuits Conference*, Feb. 6, 2001, 3 pgs.

Tokoro, Kenji, et al., Anisotropic Etching Properties of Silicon in KOH and TMAH Solutions, International Symposium on Micromechatronics and Human Science, *IEEE*, 1998, 6 pgs.

Wang, X., et al., "Band alignments in sidewall strained Si/strained SiGe heterostructures", (May 28, 2002), 1-5.

Wolf, Stanley, et al., Silicon Processing for the VLSI Era, vol. 1: Process Technology, *Lattice Press*, Sep. 1986, 3 pgs.

Xiong, Weize, et al., Improvement of FinFET Electrical Characteristics by Hydrogen Annealing, *IEEE Electron Device Letters*, 25(8), Aug. 2004, 3 pgs.

Xiong, W., et al., Corner Effect in Multiple-Gate SOI MOSFETs, *IEEE*, 2003, 3 pgs.

Yang, Fu-Liang, et al., 5nm-Gage Nanowire FinFET, *IEEE*, 2004, 2 pgs.

Auth, Christopher P., et al., Vertical, Fully-Depleted, Surrounding Gate MOSFETs on sub-0.1 um Thick Silicon Pillars, *54th Annual Device Research Conference Digest*, 1996, 2 pgs.

Bandyopadhyay, Krisanu, et al., "Self-Assembled Monolayers of Small Aromatic Disulfide and Diselenide Molecules on Polycrystalline Gold Films:", Department of Chemistry & Regional Sophisticated Instrumentation Centre, India *Institute of Technology*, (Apr. 30, 1999).

Burenkov, A., et al., Corner Effect in Double and Triple Gate FinFETs, European Solid-State Device Research 2003, *33rd Conference on ESSDERC*, 4pgs.

Chang, L., et al., CMOS Circuit Performance Enhancement by Surface Orientation Optimization, *IEEE Transactions on Electron Devices*, vol. 51, No. 10, Oct. 2004, 7 pgs.

Chang, S. T., et al., 3-D Simulation of Strained Si/SiGe Heterojunction FinFets, *Semiconductor Device Research Symposium*, Dec. 2003, 2 pgs.

Choi, Yang-Kyu, et al., A Spacer Patterning Technology for Nanoscale CMOS, *IEEE*, (49)3, XP-001102694, Mar. 2002, 6 pgs.

Choi, Yang-Kyu, et al., Sub-20nm CMOS FinFET Technologies, *IEEE, IEDM*, 2001, 4pgs.

Collaert, N., et al., A Functional 41-stage ring oscillator using scaled FinFET devices with 25-nm gate lengths and 10-nm fin widths applicable for the 45-nm CMOS node, *IEEE Electron Device Letters*, vol. 25, No. 8, Aug. 2004, 3 pgs.

(56) References Cited

OTHER PUBLICATIONS

Fried, David M., et al., Improved Independent Gate N-Type FinFET Fabrication and Characterization, *IEEE 24*(9), Sep. 2003, 3 pgs.

Fried, David M., et al., High-Performance P-Type Independent-Gate FinFETs, *IEEE 25*(4), 2004, 3 pgs.

Guo, Jing, et al., Performance Projections for Ballistic Carbon Nanotube Field-Effect Transistors, *Applied Physics Letters 80*(17), Apr. 29, 2002, 3 pgs.

Hisamoto, Digh, et al., A Fully Depleted Lean-Channel Transistor (Delta)-A Novel Vertical Ultrathin SOI MOSFET, *IEEE Electron Device Letters*, V. 11 (1), Jan. 1990, 4 pgs.

Hisamoto, Digh, et al., A Folded-Channel MOSFET for Deepsub-tenth Micron Era, *1998 IEEE International Electron Device Meeting Technical Digest*, 3 pgs.

Hisamoto, Digh, et al., FinFET-A Self-Aligned Double-Gate MOSFET Scalable to 20 nm, *IEEE Transaction on Electron Devices*, vol. 47, No. 12, Dec. 2000, 6 pgs.

Huang, Xuejue, et al., "Sub 50 nm FinFET: PMOS", *1999 IEEE International Electron Device Meeting Technical Digest*, (1999), pp. 67-70.

Ieong, M., et al., Three Dimensional CMOS Devices and Integrated Circuits, *IEEE CICC* San Jose CA Sep. 21-24, 2003, 8 pgs.

Javey, Ali, et al., *High-k dielectrics for advanced carbon-nanotube transistors and logic gates*, www.nature.com/naturematerials.com, 2002, 6 pgs.

Javey, Ali, et al., Ballistic carbon nanotube field-effect transistors, *Nature*, vol. 424, Aug. 7, 2003, 4 pgs.

Jones, E. C., et al., Doping Challenges in Exploratory Devices for High Performance Logic, *14th Int'l Conference*, Piscataway, NJ, Sep. 22-27, 2002, 6 pgs.

Kim, Sung M., et al., A Novel Multi-channel Field Effect Transistor (McFET) on Bulk Si for High Performance Sub-80nm Application, *IEEE*, 2004, 4 pgs.

\* cited by examiner

STACKING FAULT AND TWIN BLOCKING BARRIER FOR INTEGRATING III-V ON SI

RELATED APPLICATIONS

The present application is a divisional of U.S. patent application Ser. No. 11/498,901 filed on Aug. 2, 2006, now U.S. Pat. No. 8,143,646 which is incorporated herein by reference.

BACKGROUND OF THE INVENTION

1. Field of the Invention

The present invention relates to integrating III-V semiconductor devices upon silicon substrates. More particularly this invention relates to the buffer layer between a III-V semiconductor device and a silicon substrate.

2. Discussion of Related Art

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as CMOS and quantum well (QW) transistors fabricated from extreme high mobility materials such as, but not limited to, indium antimonide (InSb), indium gallium arsenide (InxGa1−xAs) (x>0.53) and indium arsenide (InAs). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by monolithically integrating them with conventional devices of silicon and use of a silicon substrate has the additional advantage of cost reduction.

Despite all these advantages, the growth of III-V materials upon silicon substrates presents many challenges. Crystal defects are generated by lattice mismatch, polar-on-nonpolar mismatch and thermal mismatch between the III-V semiconductor epitaxial layer and the silicon semiconductor substrate. When the lattice mismatch between the epitaxial layer and substrate exceeds a few percent, the strain induced by the mismatch becomes too great and defects are generated in the epitaxial layer when the epitaxial film relaxes. Once the film thickness is greater than the critical thickness (film is strained below this thickness and relaxed above this thickness), the strain is relaxed by creating misfit dislocations at the film and substrate interface as well as in the epitaxial film. The epitaxial crystal defects are typically in the form of threading dislocations, stacking faults and twins (periodicity breaks where one portion of the lattice is a mirror image of another). Many defects, particularly threading dislocations, tend to propagate into the "device layer" where the semiconductor device is fabricated. Generally, the severity of defect generation correlates to the amount of lattice mismatch between the III-V semiconductor and the silicon substrate. For these reasons, the large lattice mismatch (approximately 19.2% between the exemplary indium antimonide (InSb) and silicon (Si) combination) typically results in an epitaxial device layer having a high defect density, on the order of $1 \times 10^9$ cm$^{-2}$ to $1 \times 10^{10}$ cm$^{-2}$. The high defect density reduces the carrier mobility theoretically possible in bulk InSb, eliminating many of the technical advantages of "InSb-on-silicon" integration. For example, the electron mobility in bulk InSb films is estimated to be approximately 76,000 cm$^2$/Vs. However, to date, the best reported electron mobility of an InSb film formed over a silicon substrate is significantly lower, approximately 40,000-50,000 cm$^2$/Vs.

Similarly, a high defect density is also detrimental to photonic devices formed in or upon III-V semiconductor device layers on silicon substrates. The recombination-generation (R-G) energies of crystal defects are typically mid-gap, detracting from the performance of a semiconductor device layer that has been band gap engineered for a particular optical wavelength.

Various buffer layers have been used in attempts to relieve the strain induced by the lattice mismatch between the silicon substrate and the III-V device layer and thereby reduce the detrimental defect density of the device layer. For example, as shown in apparatus 100 of FIG. 1A, a material forms a buffer layer 170 between a silicon substrate 110 and a III-V device layer 180. A semiconductor device 190 is then fabricated in or upon device layer 180. Various materials have been utilized as the buffer layer 170. For example, an aluminum antimonide (AlSb) buffer layer 170 has been attempted as has a strontium titanate (SrTiO$_3$) buffer layer 170 between a silicon substrate 110 and a III-V device layer 180. In practice however, as depicted in FIG. 1B, these buffer layers are unable to prevent twins 171, threading dislocations 173 and stacking faults 175 from propagating into the III-V device layer 180 as twins 181, threading dislocations 183, and stacking faults 185. Thus, there remains a need for a buffer layer architecture that enables lower defect density III-V semiconductor device layers formed upon silicon substrates.

DETAILED DESCRIPTION OF THE PRESENT INVENTION

In various embodiments, a stacking fault and twin blocking barrier for integrating III-V semiconductor devices on silicon substrates is described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 1A:
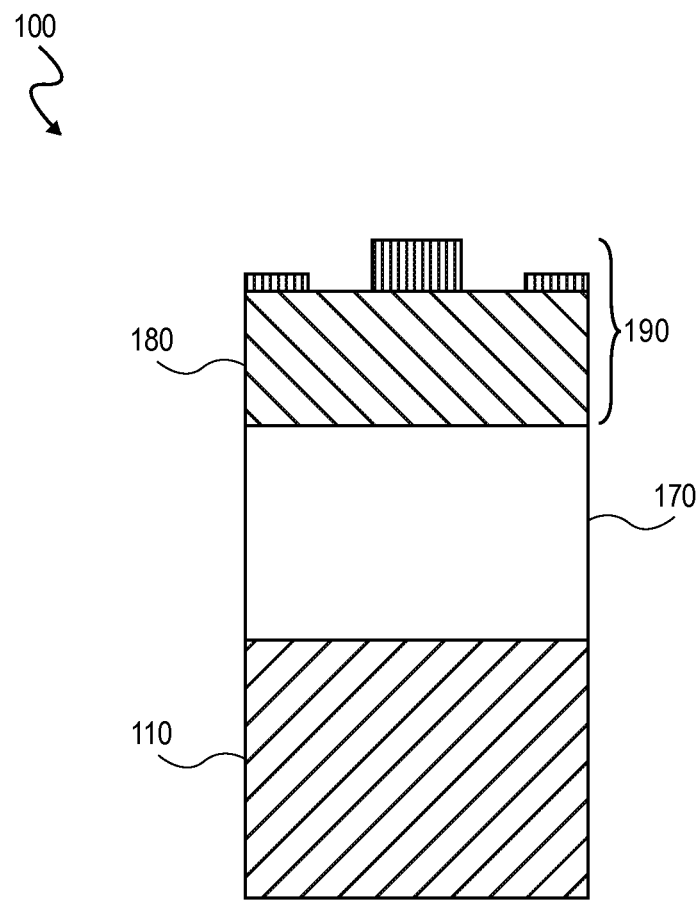
FIG. 1A is an illustration of a cross-sectional view of a conventional group III-V semiconductor device formed upon a silicon substrate.
Figure 1B:
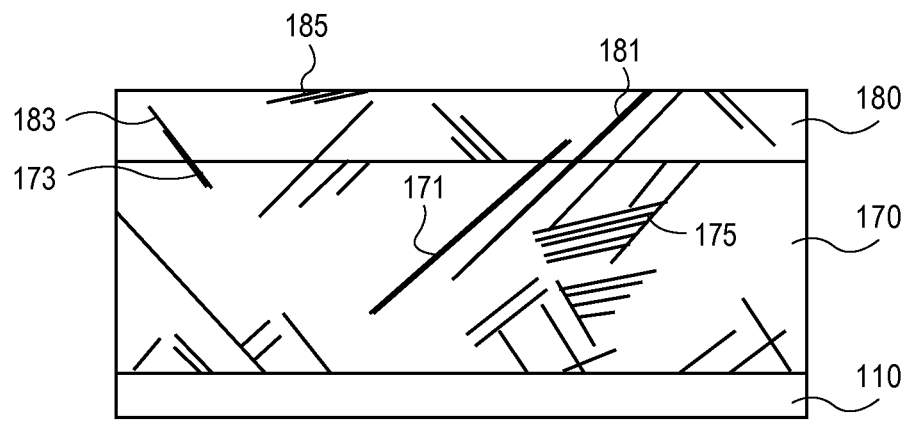
FIG. 1B is an illustration of a cross-sectional view of a conventional group III-V semiconductor device layer formed upon a silicon substrate.
Figure 2:
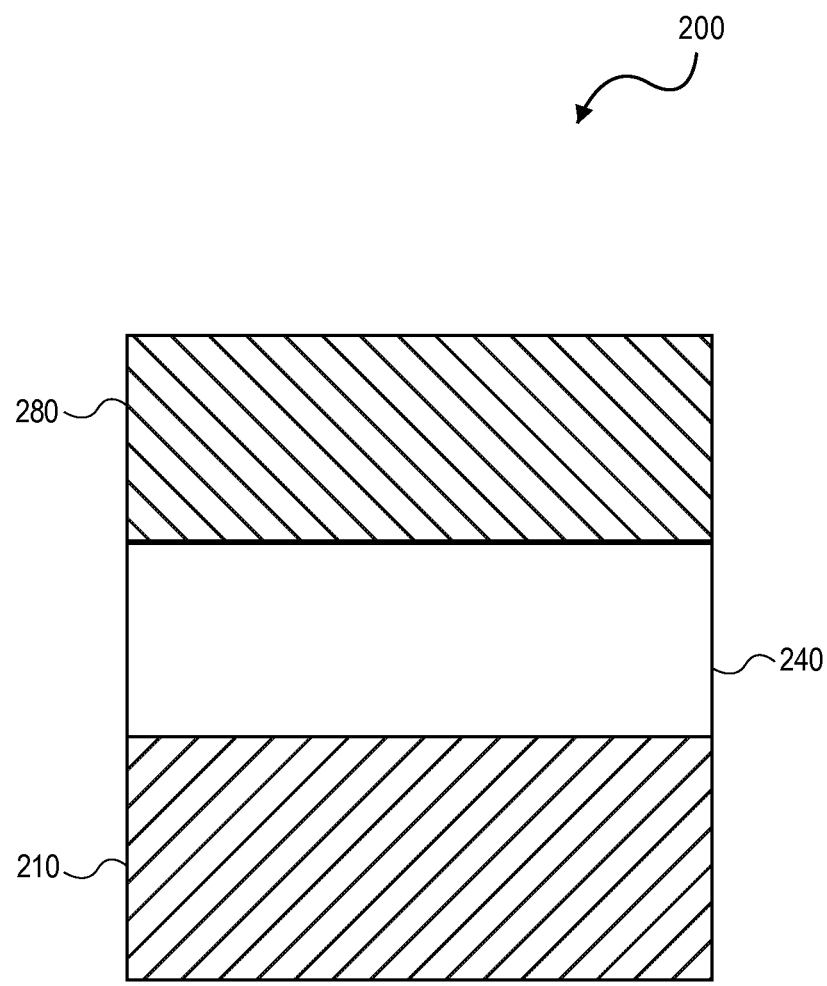
FIG. 2 is an illustration of a cross-sectional view of a group III-V semiconductor device layer formed upon a silicon substrate in accordance with the present invention.

Embodiments of the present invention reduce the dislocations within the III-V device layer formed over a silicon substrate to near bulk-like quality by utilizing a buffer architecture and specific fabrication techniques tailored to the particular III-V device layer desired. As shown in FIG. 2, embodiments of the present invention utilize a III-V semiconductor material buffer layer 240 formed between a silicon substrate 210 and III-V device layer 280 to form a semiconductor stack 200. In embodiments of the present invention, the III-V buffer layer 240 architecture is engineered for a particular III-V device layer material 280 with the materials for the III-V buffer layer 240 selected with consideration of lattice constant, band gap and melting point for the purpose of controlling nucleation and propagation of defects generated by lattice mismatch strain.

In particular embodiments, the III-V buffer layer 240 is formed on a vicinal surface of silicon substrate 210 having regular arrays of double-stepped (100) terraces across the substrate surface. A vicinal surface is a higher order crystal plane of the silicon substrate, such as, but not limited to the (211), (511), (013), (711) planes. A vicinal substrate surface having double-stepped terraces is capable of suppressing anti-phase domains (APD) in the III-V buffer layer 240. An APD is created when a first polar crystal domain of layer 240, having group III atoms attached to the nonpolar silicon substrate surface, meets a second polar crystal domain of layer 240, having group V atoms attached to the silicon substrate. A crystal discontinuity forms in layer 240 at the border between these first and second domains providing recombination-generation centers detrimental to the operation of a semiconductor device. The term "polar" refers to the partially ionic bonding character between the constituents of a III-V compound semiconductor.

Embodiments providing the double atomic step in the silicon substrate 210 provide for a terrace level of sufficient depth to prevent the growth species of buffer layer 240 from bonding to a higher level terrace even after all binding sites in the lowest terrace are occupied. Thus, the double step terrace prevents ad-hoc surface bonding so that the growth of the III-V buffer layer 240 proceeds in a stepwise fashion with each polar group III-V atomic bi-layer sequentially filling the lowest terrace of the nonpolar group IV, silicon substrate. In some embodiments, anti-phase domains are eliminated by growing layer 240 to a thickness greater than approximately 1.5 um. At such thicknesses, anti-phase domains are substantially annihilated and a single domain film can be formed even on first order planes, such as, but not limited to, the (100) silicon substrates commonly used for microelectronic fabrication. In alternative embodiments, a single domain layer 240 is grown such a manner that the formation of anti-phase domains is avoided. In such embodiments layer 240 may not be required to be thick, and may for example, be less than approximately 0.1 um in thickness using offcut Si substrate along with proper growth parameters such as growth rate, growth temperature and starting growth precursors. Additionally, buffer layer 240 grown according to embodiments of this invention may be substantially free of stacking faults and twins. The phrase substantially free of stacking faults and twins as used herein means that stacking fault and twin densities cannot be accurately measured using cross-section TEM or bandwidth TEM because such methods lose resolution below the detectible range of approximately $1 \times 10^7$ cm$^{-2}$.

In a particular embodiment, the III-V buffer layer 240 has a lattice spacing larger than the silicon substrate 210, and the III-V device layer 280 has a lattice spacing larger than the III-V buffer layer 240. In one such an embodiment, buffer 240 is comprised of a gallium antimonide (GaSb) layer 240 formed between the silicon substrate 210 and an indium antimonide (InSb) device layer 280. The 6.09 Å lattice constant of GaSb layer 240 is approximately 12.2% larger than the 5.43 Å lattice constant of the Silicon substrate 210 upon which layer 240 is formed. The 6.48 Å lattice constant of the InSb layer 280 is approximately 6.2% larger than the GaSb layer 240. Thus, in this particular embodiment, the lattice constant of the buffer 240 incremented the lattice spacing of the silicon substrate 210 to the lattice spacing of the III-V device layer 280, thereby partitioning the total lattice mismatch between two separate material interfaces. In this manner, the InSb device layer 280 need only accommodate the strain of a 6.2% lattice mismatch with GaSb layer 240 rather than the entire 19.2% mismatch with the silicon substrate 210.

It should be appreciated that various III-V device layers, such as, but not limited to, indium arsenide (InAs) device layers may be similarly integrated with silicon substrates using other buffer embodiments. For example, in another embodiment of the present invention, III-V buffer layer 240 is comprised of a gallium arsenide (GaAs) formed between the silicon substrate 210 and indium arsenide (InAs) device layer 280 to graduate the lattice constant in a manner analogous to that just described for the InSb embodiment.

In embodiments of the present invention, the buffer 240 comprises materials which glide dislocations and terminate a significant percentage of the dislocations within the layer. In particular embodiments, the III-V buffer layer 240 is comprised of a relatively narrow band gap III-V semiconductor material. Generally, the extent of dislocation glide is dependent on the hardness of the material, with glide occurring more readily in softer materials. Semiconductor materials of narrower band gap are typically softer, and it has been found more dislocation glide occurs in narrower band gap materials. Furthermore, more of the dislocations are terminated or contained as the thickness of a material capable of dislocation glides is increased. In one particular embodiment, the III-V buffer layer 240 is GaSb having a thickness between approximately 0.3 um and 5.0 um. GaSb readily glides defects because the band gap of GaSb is relatively narrow, approximately 0.7 eV. Dislocation glide occurring within the GaSb changes the direction a defect propagates. This is particularly true for threading dislocations which typically propagate at an approximate sixty degree angle from the substrate surface. Gliding can change the direction of a threading dislocation to an angle more parallel to the surface of the film to terminate or contain the dislocations within the film as the buffer layer is thickened. For this reason, many of the defects induced by the strain of the 12.2% lattice mismatch between the silicon substrate 210 and a III-V buffer layer 240 of GaSb are glided and contained within the GaSb layer 240. Because many such glided dislocations will not propagate into subsequently grown films, it is therefore possible to avoid simply accumulating defects within the subsequent epitaxial layers.

As previously discussed, the 6.09 Å lattice constant of GaSb layer 240 is approximately 12.2% larger than the 5.43 Å lattice constant of the Silicon substrate 210 upon which layer 240 is formed. Because the band gap of GaSb is approximately 0.7 eV, the GaSb layer 240 is relatively soft and able to glide dislocations. In the same vein, it should be apparent that an embodiment utilizing GaSb provides better dislocation glide characteristics than an embodiment utilizing GaAs for the III-V buffer layer 240 because band gap of GaSb is lower than GaAs.

In embodiments of the present invention, the III-V buffer layer 240 has a low melting point temperature which improves the thermal activation of dislocation glide within layer 240 during the subsequent layer growth. Dislocation glide reduces the propagation of threading dislocations, stacking faults and twins into the subsequent layers. In a particular embodiment, for example, a III-V buffer layer 240 of GaSb has a melting point of approximately 712 C. In another particular embodiment, the melting point of a GaAs layer 240 is approximately 1237 C. Generally, the lower the melting point of the material, the better the dislocation glide.

In particular embodiments, buffer 240 allows for subsequent growth of a device layer 280 having an acceptably low final defect density. For such embodiments, the buffer 240 accommodates much of the 19.2% lattice mismatch between InSb device layer 280 and silicon substrate 210 to obtain a device layer having a threading dislocation defect density below $1 \times 10^8$ cm$^{-2}$.

In embodiments of the present invention, the III-V device layer 280 of FIG. 2 is of the desired material and of a sufficient thickness to achieve low defect density. Because the lattice spacing of the III-V device layer 280 is considered in the design of the buffer 240, the III-V device layer 280 has significantly less lattice mismatch relative to the buffer 240 than to the silicon substrate 210. A substantial portion of the defects in device layer 280 generated by lattice mismatch strain or propagated from the buffer 240 are glided within III-V device layer 280 as the thickness of 280 is increased. In an embodiment of the present invention the device layer 280 is grown to approximately 2.5 um thick to ensure defect density in the device layer 280 is below $1 \times 10^8$ cm$^{-2}$. In another embodiment the device layer 280 is grown to at least 7.5 um thick. Thus, the present embodiments provide for device-grade InSb on silicon substrates enabling electronic structures such as quantum well transistors to be formed on silicon substrates.

Figure 5:
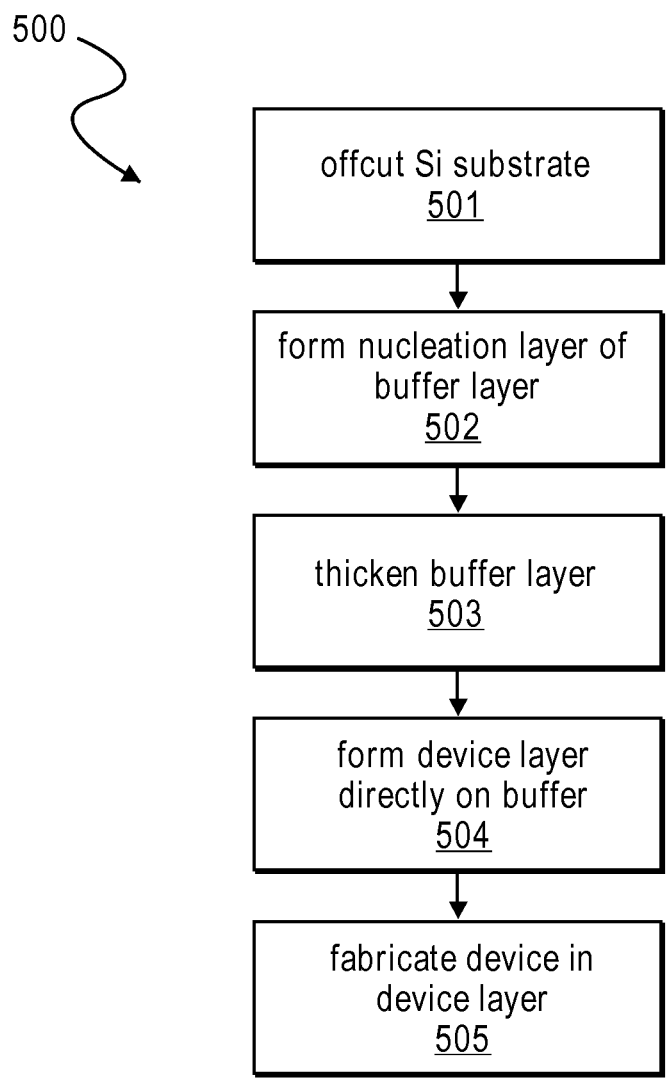
FIG. 5 is a flow diagram of a method of fabricating a group III-V semiconductor device layer upon a silicon substrate in accordance with the present invention.

FIG. 5 is a flow diagram of a method to fabricate a III-V device layer in accordance with an embodiment of the present invention. Method 500 of FIG. 5 begins with an offcut silicon substrate at step 501. At step 502, a nucleation layer is formed as the initial step of a two step process to form a buffer layer. At step 503, the buffer layer is thickened with a growth process distinct from that used at step 502. In step 504, a III-V device layer is formed directly on the buffer and a device is fabricated in the III-V device layer at step 505. Each of these steps is discussed in greater detail below in reference to FIGS. 3A-3D.

Figure 3A:
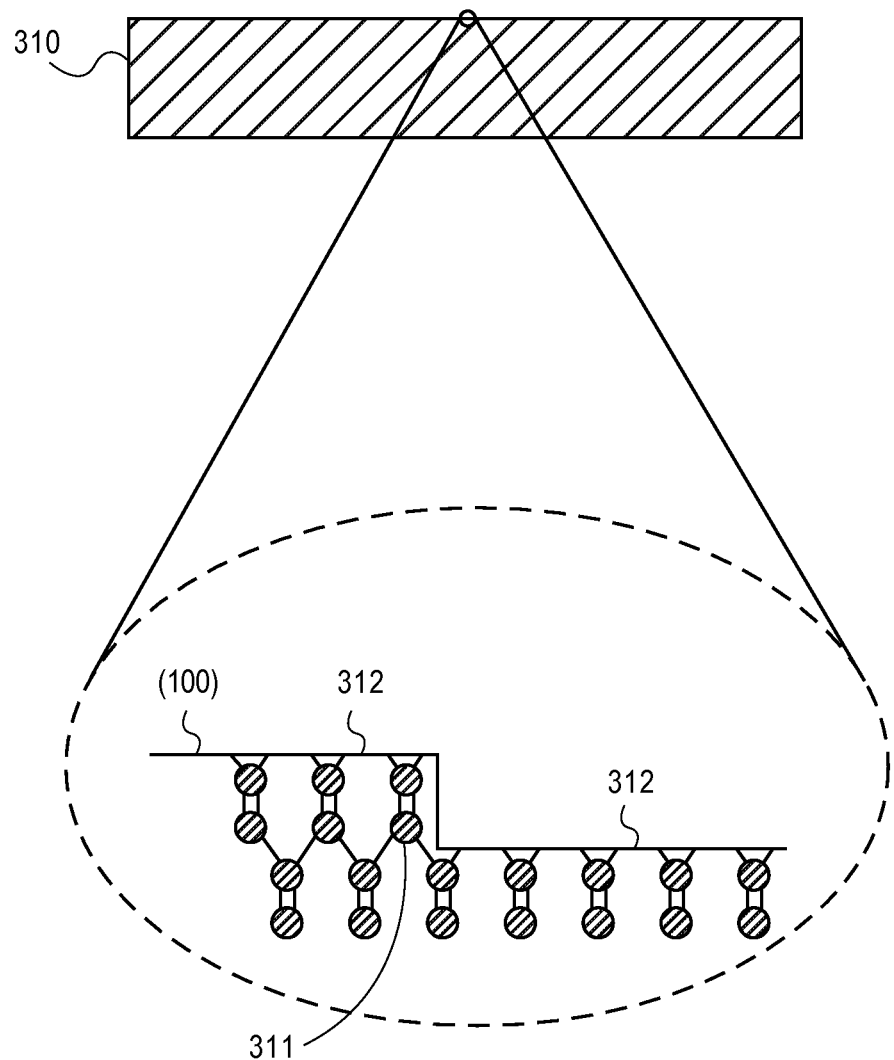
FIGS. 3A-3D are illustrations of cross-sectional views of a method of fabricating a group III-V semiconductor device layer upon a silicon substrate in accordance with the present invention.

Fabrication begins with silicon substrate 310. In a particular embodiment, substrate 310 has a vicinal surface, as shown in FIG. 3A. A vicinal surface is prepared by off-cutting the substrate from an ingot. In one such embodiment, the ingot is grown to provide wafer slices having (100) surfaces. The (100) substrate surface is then offcut at an angle between 2 and 12 degrees towards the [110] direction to produce a surface having terraces 312. Terraces 312 include a surface having a (100) crystal plane. The (100) plane surface area of each terrace 312 depends on the specific offcut angle, with a greater angle producing a greater number of terraces, each terrace having lesser (100) surface area. In such embodiments, the offcut produces a vicinal surface having an array of (100) terraces, many of which are separated by a double atomic step. As shown in the expanded view of FIG. 3A, a double step terrace has a height of two silicon atoms 311. In another embodiment, the silicon substrate offcut orientations are (211), (511), (013), (711) and other high index planes. Optionally, silicon substrate 310 is without an offcut (zero degree offcut), such as, but not limited to, common (100) substrates. Such a substrate (not pictured) typically does not have a substantial number of double atomic step terraces.

Next, the III-V buffer layer is formed upon the silicon substrate 310. Commonly known growth techniques may be used to form the III-V buffer layer, such as, but not limited to, metalorganic chemical vapor deposition (MOCVD) or molecular beam epitaxy (MBE). As previously discussed, in particular embodiments, the buffer is formed in a manner that either avoids the formation of anti-phase domains (APD) or annihilates them as the film thickness is increased.

Figure 3B:
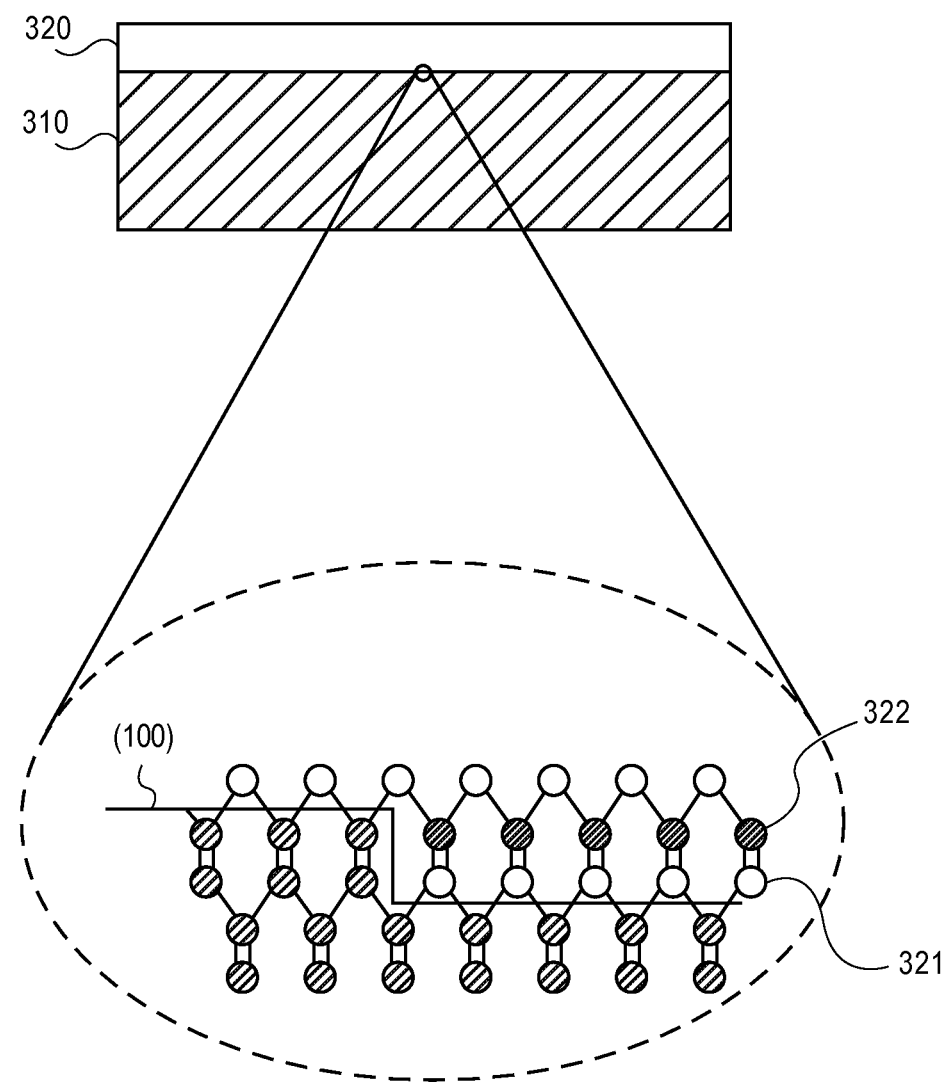
Figure 3C:
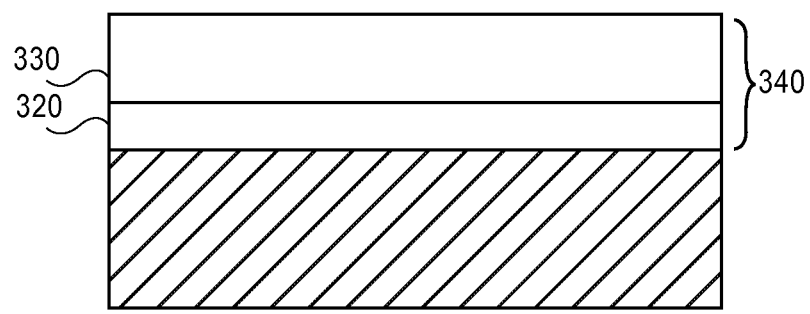

In a particular embodiment, as shown in FIG. 3B and FIG. 3C, the III-V buffer layer 340 is formed using a two step process, wherein the growth conditions of each step are distinct. In the first step, as shown in FIG. 3B, a nucleation layer 320 is formed. The growth of nucleation layer 320, as shown in the expanded view, successively fills the lowest silicon substrate terraces with atomic bi-layers of the III-V semiconductor buffer material. In this embodiment, the mobility of both the group III and group V species of the nucleation layer 320 are sufficiently high that the atomic species introduced to the silicon surface travel about the surface of silicon substrate 310 and either fall into a terrace or completely off the silicon substrate surface. A species which falls down a terrace wall lacks the energy to scale back up the terrace wall, therefore the otherwise substantially random species motion can be effectively funneled in a direction dictated by the substrate terracing. Once the species reaches the lowest terrace, the silicon substrate bonding sites are located by the mobile species until every site is filled. Because of the double atomic step in the silicon substrate 310, a terrace completely filled with species 321 presents a single atomic step which the mobile species is unable to scale, and so excess species travel off the substrate surface without a significant number bonding to sites in the upper terrace levels. Subsequent introduction of the second species of the polar atomic pair is similarly funneled to the lowest terrace to bond with the first atomic species 321 to completely fill the lowest terrace with species 322. The growth process then proceeds in this iterative fashion until all terraces are filled and no nonpolar silicon substrate surface remains, at which point there is no longer risk of forming an APD in the polar buffer materials. Thus, depending on the offcut angle of the substrate, the number of terraces which must be successively filled varies. As the offcut angle increases, the number of terrace levels increases and the thickness of the nucleation layer must be increased to fill every terrace. In particular embodiments, therefore, the nucleation layer 320 is between approximately 50 Å and approximately 500 Å. In some embodiments, the nucleation layer 320 is between approximately 30 Å and approximately 300 Å.

The high mobility required to ensure the terraces are successively filled is provided for by the growth parameters of the nucleation layer 320 and these parameters therefore depend on the particular mobility characteristics of species comprising the material of layer 320. For example, in one embodiment, a nucleation layer 320 is formed using migration enhanced epitaxy (MEE) at a temperature of between 300 C and 600 C. MEE proceeds in a fashion similar to that of atomic layer deposition (ALD). MEE has a relatively slower growth rate, approximately 0.1 um/hr, because once the group V element is introduced to the substrate there is a hold time during which both the group V source and group III source shutters are closed (shuttered). This hold time accommodates the relatively lower mobility of the group V species. No hold time is required for group III species because surface migration of this species relatively higher mobility. In a particular MEE embodiment, the substrate surface is exposed to an antimony (Sb) source for approximately 10 seconds to form a monolayer of Sb on the lowest terrace level. The Sb source and is then shuttered for a hold time of approximately 60 seconds. This relatively long hold time allows for the Sb species to migrate on the surface of the silicon substrate to ensure the bonding sites of the lowest terrace level are filled. Then, the substrate surface is exposed to a gallium (Ga) source for approximately 10 seconds. No hold time is required because of the high surface mobility of Ga. Next, the Sb is reopened for approximately 10 second and then again closed for a hold time. This process is repeated to form a GaSb nucleation layer 320 sufficiently thick to fill all the terraces of the silicon substrate 310, approximately 150 Å in a particular embodiment. In an embodiment, GaSb nucleation temperatures are in between 300 C. and 600 C. In particular GaSb embodiment, the MEE growth temperature is between approximately 400 C. and approximately 510 C. Higher temperature embodiments enable a higher quality film. In other embodiments, MEE can be utilized to form a nucleation layer of an alternate buffer material, such as, but not limited to GaAs.

In yet another embodiment, a nucleation layer 320 is formed on the vicinal silicon substrate 310 utilizing traditional MBE (without migration enhancement). The relatively higher flux of this particular embodiment using traditional MBE provides higher film growth rates and therefore higher throughput than MEE embodiments. In a particular MBE nucleation embodiment, GaSb is formed on the silicon substrate 310 at a temperature between approximately 400 C. and approximately 510 C. The high-flux embodiments are well suited to GaSb because of the relatively low vapor pressure and high sticking coefficient of antimony (Sb) as compared to arsenic (As) of GaAs films.

Next, as shown in FIG. 3C, a second growth step completes the formation of the III-V buffer layer 340. This second growth step, performed at a higher temperature than that used for the nucleation layer 320, forms layer 330 to thicken the III-V buffer layer 340 and glide dislocations. The film quality of layer 330 is superior to that of the nucleation layer 320 because it is formed at a higher growth temperature. Also, during the formation of layer 330, the flux rate can be relatively high because the polar nucleation layer 320 eliminates any danger of APD formation. In an embodiment, a GaSb film 330 is grown upon a GaSb nucleation layer 320 at a growth temperature in the range of 500 C. and 700 C. In a particular embodiment, a GaSb film 330 is grown upon a GaSb nucleation layer 320 at a growth temperature between approximately 510 C. and 570 C. In some embodiments of the present invention, the GaSb film 330 is grown to a thickness between approximately 0.3 um and 5.0 um. In an alternate embodiment, a GaAs film 330 is grown in a similar fashion upon a GaAs nucleation layer 320.

In other embodiments of the present invention, it is preferred to have a thin buffer layer 340. In some embodiments, a thin buffer layer 340 may function as a wetting layer, being only as thick as needed to bridge the non-polar/polar interface between the substrate 310 and buffer layer 340, as well as avoid the formation of anti-phase domains. Because the buffer layer 340 is thin, it is less efficient at transferring strain into a subsequently deposited layer than a thick buffer layer 340 may be. In one particular embodiment, the GaSb film 330 is grown to a maximum thickness of 0.3 um. In yet another embodiment, the GaSb film 330 is grown to a maximum thickness of 0.1 um. In some embodiments it is desirable to have the entire GaSb buffer layer 340, including nucleation layer 320 and layer 330, below approximately 0.1 um.

In still another embodiment, the III-V buffer layer 340 is formed on a traditional silicon substrate 310 having a lower order plane surface, such as, but not limited to (100). The III-V buffer layer 340 is grown without a nucleation step and permitted to form anti-phase domains. In an embodiment, the single-step growth is performed at a temperature between 500 C. and 700 C. Once the film thickness is greater than approximately 1.5 um, the anti-phase domains, along with the stacking faults and twins, are substantially annihilated and the film becomes single-domain. In a particular embodiment, a III-V buffer layer 340 comprising between approximately 1.5 and 2.0 um GaSb is formed on a traditional (100) silicon substrate 310 that has a 0 degree offcut.

Figure 3D:
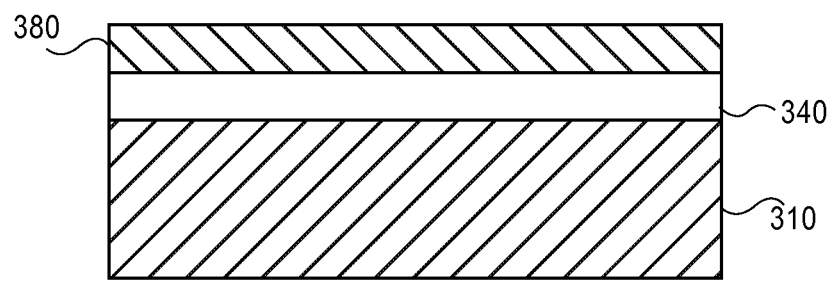

Finally, with the completion of the buffer 340, device layer 380 is formed, as shown in FIG. 3D. Device layer 380 is grown at a temperature appropriate for the particular III-V material desired. In a particular embodiment, wherein buffer layer 340 comprises GaSb, an InSb device layer 380 is formed at a growth temperature between approximately 350 C. and approximately 475 C. Depending on the amount of lattice mismatch between the buffer 340 and the III-V device layer 380, as well as the ability for the device layer to glide dislocations, the device layer 380 is grown to a thickness sufficient to give an acceptable defect density. In a particular embodiment, an InSb device layer 380 is grown to a thickness greater than approximately 2 um. In a further embodiment, an InSb device layer 380 is grown to a thickness of approximately 8 um to achieve a defect density of approximately $4 \times 10^7$ cm$^{-2}$.

In a particular embodiment, the device layer 380 may have a larger lattice constant material than the buffer layer 340. For example, wherein buffer layer 340 comprises GaSb with a lattice constant of approximately 6.09 Å, the device layer 380 may comprise InSb, which has a lattice constant of approximately 6.48 Å. In such an embodiment, the GaSb buffer layer 340 may induce a compressive stress into the larger lattice constant InSb device layer 380. The larger lattice constant InSb device layer 380 will retain the strain up until the device layer 380 reaches its critical thickness. Beyond the critical thickness, a lattice mismatched layer will relax, thus reducing strain. In one embodiment, an InSb device layer 380 grown at less than 410 C. will have a critical thickness of approximately 100 Å.

In another embodiment, the device layer 380 may have a smaller lattice constant than the buffer layer 340. For example, wherein the buffer layer 340 comprises GaSb with a lattice constant of approximately 6.09 Å, the device layer 380 may be comprised of a smaller lattice constant material such as $In_xGa_{1-x}As$ (x~0.7, ~5.9 Å), InAs (6.06 Å), or InP (5.87 Å). In such an embodiment, a strained device layer 380 may be detrimental to device performance. For example, a tensilely strained device layer 380 may be prone to cracking, thus introducing detrimental defects. In an embodiment, where the device layer 380 has a smaller lattice constant than the buffer layer 340, the buffer layer 340 may have a maximum thickness of less than approximately 0.3 um in order to reduce the amount of strain being induced in the device layer 380.

Figure 4A:
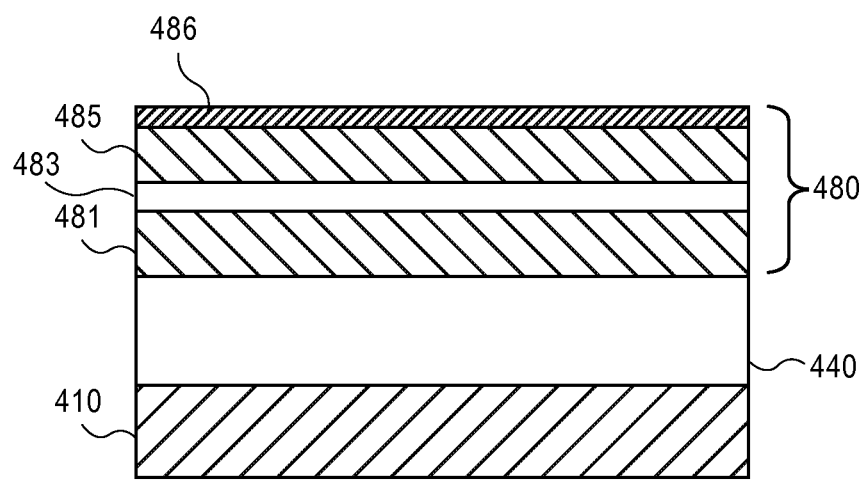
FIGS. 4A-4C are illustrations of cross-sectional views of a method of fabricating a quantum well (QW) transistor in accordance with the present invention.
Figure 4B:
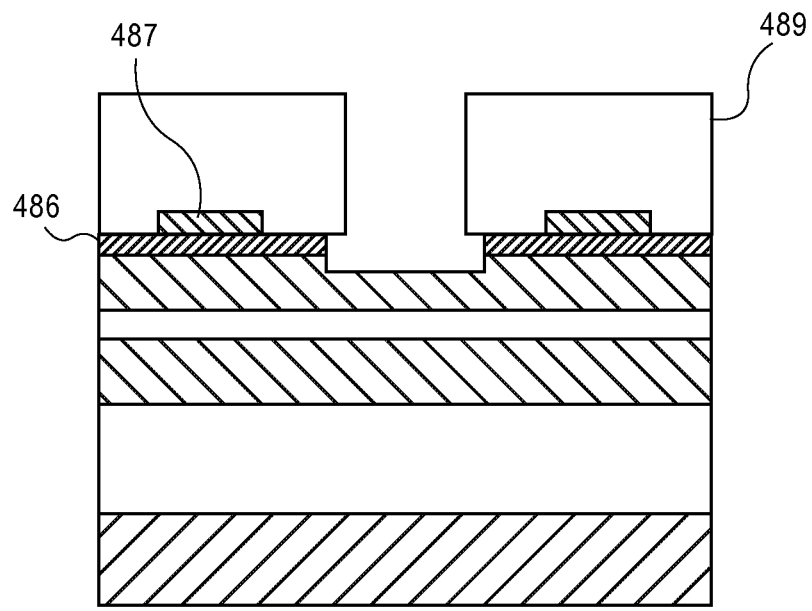
Figure 4C:
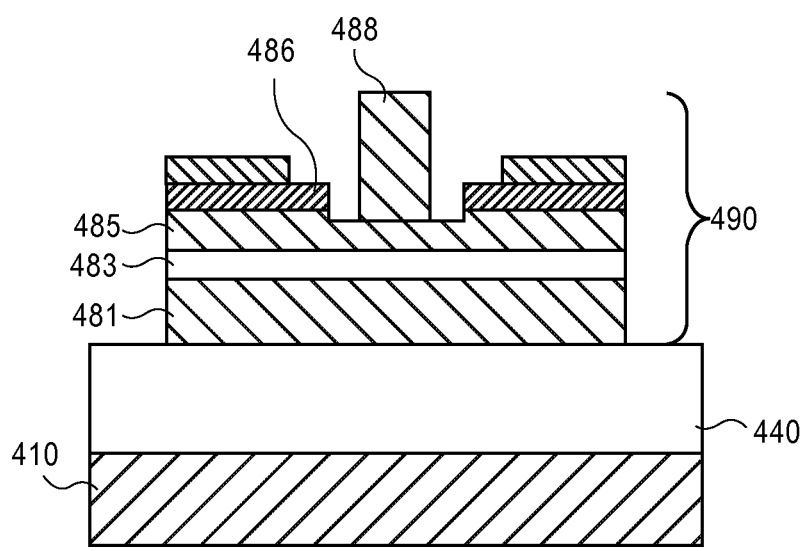

FIGS. 4A-4C depict embodiments of methods to fabricate a quantum well transistor in a III-V device layer on a substrate incorporating embodiments of the III-V buffer architecture discussed. FIG. 4A shows device layer 480 comprising a quantum well 483 between an upper barrier layer 485 and a lower barrier layer 481 formed upon the buffer 440 over silicon substrate 410.

Generally, the lower barrier layer 481 is formed of a higher band gap material than the overlying quantum well 483. The lower barrier layer 481 is of sufficient thickness to provide a potential barrier to charge carriers in the transistor channel. In a particular embodiment, the lower barrier layer thickness is between about 100 Å and about 250 Å. In other embodiments, the lower barrier is InAlSb between 2500 Å and 3000 Å thick. In still other embodiments, lower barrier layer 481 is microns thick to further reduce defect density in the quantum well 483. In certain embodiments wherein the buffer 440 is comprised of a GaSb, the lower barrier layer 481 is comprised of aluminum indium antimonide ($Al_xIn_{1-x}Sb$). In a particular embodiment, the lower barrier layer 481 is $Al_xIn_{1-x}Sb$ with 15% aluminum. In certain other embodiments wherein the buffer 440 comprises GaAs, the lower barrier layer 481 is comprised of indium aluminum arsenide (InAlAs).

Then, over the lower barrier layer 481, a quantum well 483 is formed of a material with a smaller band gap than that of the lower barrier. In an embodiment wherein the buffer 440 comprises GaSb, the quantum well 483 is doped or undoped and formed of InSb. In another embodiment wherein the buffer 440 comprises GaAs, the quantum well 483 is doped or undoped and formed of indium gallium arsenide ($In_xGa_{1-x}As$) or InAs, as two examples. Quantum well 483 is of a sufficient thickness to provide adequate channel conductance. In certain embodiments, the thickness of the quantum well 483 is between about 50 Å and about 300 Å.

Over the quantum well 483 is the upper barrier layer 485. Upper barrier layer 485 has a larger band gap than the quantum well 483, thereby confining a majority of charge carriers within the quantum well 483 for reduced device leakage. The upper barrier layer 485 may be formed of the same or different materials as the lower barrier layer 481. In certain embodiments wherein the buffer 440 comprises GaSb, the upper barrier layer 485 comprises aluminum indium antimonide ($Al_xIn_{1-x}Sb$). In a particular embodiment, the upper barrier layer 485 is $Al_xIn_{1-x}Sb$ with 15% aluminum. In certain other embodiments, wherein the buffer 440 comprises GaAs, the upper barrier layer 485 comprises indium aluminum arsenide (InAlAs). The upper barrier layer 485 may include a delta-doped layer (not shown) to supply carriers for embodiments where the lower quantum well is undoped (optionally the lower barriers 481 may be similarly doped to supply carriers). For an n-type device utilizing an $Al_xIn_{1-x}Sb$ upper barrier 485, the delta doping may be done using silicon (Si) or tellurium (Te) impurities, as two examples. The upper barrier layer 485 may have various thicknesses and in certain embodiments the upper barrier layer 485 is between about 40 Å and 400 Å thick.

Finally, to complete device layer 480 as shown in FIG. 4A, a highly-doped source drain layer 486 is formed above the upper barrier layer 485. In a particular embodiment, the source drain layer 486 is n+ doped InSb between about 30 Å to about 300 Å thick.

As shown in FIG. 4B, source and drain contact metallizations 487 are then formed by commonly known deposition processes, such as electron beam evaporation or reactive sputtering. In various embodiments, as shown in FIG. 4B, a mask material 489 is used to selectively remove a portion of the semiconductor device stack in preparation for the placement of the gate electrode. Depending on whether a depletion mode or enhancement mode device is desired, selective etches may be used to form a recess having a particular depth. In particular embodiments, source drain layer 486 is removed during the gate recess etch to expose a suitable Schottky surface on the upper barrier layer 485. Commonly known dry or wet etch techniques may be utilized to form the gate recess. The etchant may be selective to the composition of the semiconductor, for example, in an embodiment, an n+ doped indium antimonide (InSb) source drain layer 486 is selectively removed using a wet etch process comprised of citric acid and peroxide. Through application of similar commonly known selective etch techniques, the recess etch depth may be tightly controlled by terminating on a stop layer grown upon the upper barrier layer 485 (not shown).

As shown in FIG. 4C, the gate electrode 488 is formed over the upper barrier layer 485. In some embodiments of the present invention, commonly known techniques are used to form the gate electrode 488 directly on the upper barrier layer 485, thereby creating Schottky junction through which the gate controls the quantum well 483. In other embodiments, commonly known techniques are used to form the gate electrode 488 on a dielectric layer over the upper barrier layer 485, thereby creating a MOS junction. In particular embodiments, the gate electrode 488 is formed using commonly known lift-off methods relying on lithography and highly directional deposition techniques, such as electron beam deposition, to separate the gate electrode 488 from the source drain layer 486.

Then, as shown in FIG. 4C, the quantum well transistor 490 is isolated using commonly known techniques. In particular embodiments, the epitaxial device layer of the quantum well transistor 490 is etched through to form an active device mesa upon the buffer 440 over silicon substrate 410. The isolation etch removes the source drain layer 486, upper barrier 485, quantum well 483 and lower barrier 481 along a perimeter of the active device to form the mesa. This enables device isolation to be achieved with minimal topography. With the quantum well transistor 490 substantially complete, backend processing is performed using commonly known techniques to connect quantum well transistor 490 to the external environment.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method of forming a semiconductor structure comprising:
   depositing a nucleation layer comprising Ga and Sb using migration enhanced epitaxy (MEE) at a first growth temperature and first growth rate of approximately 0.1 um/hr on a surface of a silicon substrate,
   depositing a buffer layer consisting essentially of GaSb at a second growth temperature and second growth rate on the nucleation layer; and
   forming a compound semiconductor device layer directly on the buffer layer;
   wherein the second growth temperature is higher than the first growth temperature.

2. The method of claim 1, wherein the surface is a (100) surface of the silicon substrate off-cut at an angle between 2 and 12 degrees towards a [110] direction.

3. The method of claim 1, wherein the surface is off-cut from a plane selected from the group consisting of: (211), (511), (711), (013).

4. The method of claim 1, wherein forming the compound semiconductor device layer upon the buffer layer further comprises depositing InSb at a growth temperature between approximately 300° C. and 500° C.

5. The method of claim 1, wherein the surface of the silicon substrate upon which the nucleation layer is deposited is a vicinal surface comprising terraces, and wherein depositing the nucleation layer includes depositing alternating monolayers of Sb and Ga until the nucleation layer is sufficiently thick to fill substantially all the terraces of the vicinal surface.

6. The method of claim 1, wherein the first growth temperature is between approximately 300° C. and 600° C.

7. The method of claim 1, wherein the second growth temperature is approximately 510° C.

8. The method of claim 1, wherein depositing the nucleation layer comprising Ga and Sb using migration enhanced epitaxy (MEE) comprises iterations of the following sequence: exposing the substrate to a Sb source, shuttering the Sb source, applying an approximately 60 second hold time in which both the Sb source and a Ga source are shuttered, exposing the substrate to the Ga source, shuttering the Ga source, and applying no hold time in which both the Sb source and the Ga source are shuttered.

9. A method of forming a compound semiconductor device layer on a silicon substrate comprising:
depositing GaSb upon a surface of the silicon substrate using migration enhanced epitaxy (MEE) at a first growth temperature and first growth rate of approximately 0.1 um/hr to form a GaSb nucleation layer, wherein the surface of the silicon substrate is off-cut from a (100) surface at an angle between 2 and 12 degrees toward a [110] direction;
depositing GaSb upon the GaSb nucleation layer at a second growth temperature and second growth rate to form a GaSb buffer layer, wherein the second growth temperature is higher than the first growth temperature; and
depositing an InSb device layer directly on the GaSb buffer layer.

10. The method of claim 9, wherein depositing GaSb upon the surface of the silicon substrate using migration enhanced epitaxy (MEE) at the first growth temperature and first growth rate to form the GaSb nucleation layer comprises iterations of the following sequence: exposing the silicon substrate to a Sb source, shuttering the Sb source, applying an approximately 60 second hold time in which both the Sb source and a Ga source are shuttered, exposing the silicon substrate to the Ga source, shuttering the Ga source, and applying no hold time in which both the Sb source and the Ga source are shuttered.

* * * * *